(12) United States Patent
Wakashima et al.

(10) Patent No.: US 6,708,398 B2
(45) Date of Patent: Mar. 23, 2004

(54) SUBSTRATE FOR USE IN PACKAGE OF SEMICONDUCTOR DEVICE, SEMICONDUCTOR PACKAGE USING THE SUBSTRATE, AND METHODS FOR MANUFACTURING THE SUBSTRATE AND THE SEMICONDUCTOR PACKAGE

(75) Inventors: Yoshiaki Wakashima, Kawasaki (JP); Naoki Fukutomi, Tokyo (JP); Kazuhisa Suzuki, Nagareyama (JP); Takeshi Funaki, Musashino (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/907,639

(22) Filed: Jul. 19, 2001

(65) Prior Publication Data

US 2002/0020909 A1 Feb. 21, 2002

(30) Foreign Application Priority Data

Jul. 31, 2000 (JP) ..................................... P2000-230190

(51) Int. Cl.[7] .............................. H05K 3/00; H05K 3/02; H05K 3/10; H01R 9/00; H01R 43/16
(52) U.S. Cl. ............................... 29/829; 29/842; 29/846; 29/874
(58) Field of Search .......................... 29/829, 842, 846, 29/874

(56) References Cited

U.S. PATENT DOCUMENTS 6,184,476 B1 * 2/2001 Takahashi et al. .......... 174/261
6,274,820 B1 * 8/2001 DiStefano et al. .......... 359/604
6,467,160 B1 * 10/2002 Cummings et al. ........... 29/831

OTHER PUBLICATIONS

Nikkei Material & Technology 94.4 (No. 149) pp18–19 (accompanied by an English language translation). (Date Not Available).
Smallest Flip–Chip–Like Package CSP; The Second VLSI Packaging Workshop of Japan, pp. 46–50, (1994).

* cited by examiner

Primary Examiner—David E. Graybill
(74) Attorney, Agent, or Firm—Greenblum & Bernstein, P.L.C.

(57) ABSTRACT

A substrate for use in a semiconductor package is fabricated by preparing a composite metal laminate consisting of a first metal layer, a second metal layer, and a carrier layer positioned in this order. The first metal layer has etching characteristics different to those of the second metal layer with respect to the same etchant. The first metal layer is selectively etched until the second metal layer is exposed, thereby forming pillar-like interconnections. The gap between the interconnections is then filled with a resin so as to form a resin base with interconnections. The carrier layer is removed from the second metal layer, and the second metal layer is selectively etched until the first metal layer or the resin base is exposed, thereby forming a conductive pattern on the resin base.

10 Claims, 6 Drawing Sheets

SUBSTRATE FOR USE IN PACKAGE OF SEMICONDUCTOR DEVICE, SEMICONDUCTOR PACKAGE USING THE SUBSTRATE, AND METHODS FOR MANUFACTURING THE SUBSTRATE AND THE SEMICONDUCTOR PACKAGE

BACKGROUND OF THE INVENTION

1. Field of the Invention

The present invention relates to a substrate used in a semiconductor package, a semiconductor package itself, and a method for manufacturing such substrates and semiconductor packages.

2. Description of the Related Art

As semiconductor integrated circuits have become increasingly dens, the number of input/output (I/O) leads has been increasing. This tendency requires semiconductor packages to accommodate a large number of I/O leads of the IC chips. Such packages are mounted on printed wiring board Two types of semiconductor packages are known, namely, a package with a line of I/O terminals along the periphery, and a package with multiple lines of I/O terminals arranged in full matrix or perimeter array. The former is typically known as QFP (Quad Flat Package). To increase the number of leads in QFP, the lead pitch must be reduced. However, if the pitch is narrowed to 0.5 mm or less, a highly advanced technique is required to connect the leads to the wiring board. The latter is known as an array type package. Array-type packages are suitable to higher I/O integrated circuits because a large number of pins can be arranged at a relatively wide pitch. A conventionally known array type package is PGA (pin grid array). The array-type package is also known as an insertion type package, and is not so suitable to a surface mount package. To overcome this problem, BGA (ball grid array) packages that are suitable for surface mounting have been developed.

On the other hand, as the size of electronic devices become smaller, demand for reducing the package size has increased. To response to this demand, a so-called chip size package (CSP) that is almost equal in size to a semiconductor chip has been proposed. CSP is configured to have connection terminals to the external wiring board, which are included within the surface-mounted area of the semiconductor chip, instead of around the semiconductor chip. CSP is fabricated by, for example, attaching a polyimide film having preformed bumps onto the surface of the semiconductor chip, electrically connecting the chip and the substrate by gold leads, and encapsulation-potting the device by epoxy-resin potting (NIKKEI MATERIAL & TECHNOLOGY 94.4 No. 140, pp.18–19). Another example of fabricating CSP is by forming metallic bumps on a temporary substrate for connection to the semiconductor chip and the external wiring board, face-down bonding the semiconductor chip, and transfer-molding the chip on the temporary substrate (Smallest Flip-Chip-Like package CSP; The Second VLSI Packaging Workshop of Japan, pp.46–50, 1994).

However, the above-described semiconductor package must have through-holes or via holes in order to electrically connect the semiconductor chip to the connection terminals (e.g., solder balls) to the printed wiring board. To be more precise, the semiconductor chip is connected to a conductive pattern formed on the package substrate, and the conductive pattern is connected to the connection terminals provided to the rear face of the substrate via through-holes. Generally, the substrate is drilled to form a through-hole, which is then filled with a metal by plating. Accordingly, the manufacturing process of the package substrate becomes complicated. In addition, friction heat during the drilling process results in high temperatures and adherence of resin smears to the internal copper clad layer, resulting in poor electrical conductivity.

To avoid the complication of manufacturing process and deterioration in electrical conductivity, a board (i.e., a copper-clad laminate) in which through-hole are formed in advance at connecting positions may be used. However, even if using such a holed board, the fineness of the interconnection (or through-holes) is restricted. Further problems exist. For example, conductive patterns (or circuit patterns) are generally formed by selectively etching the copper clad, and the etching precision is determined by the thickness of the copper clad. In order to form a fine conductive pattern on the package substrate, the copper clad used in the laminate board must be thin, or alternatively, the thickness of the copper foil must be reduced at some point during the patterning step. This means that the manufacturing process for a fine-pattern package substrate is still complicated and troublesome.

If using a laminate with a very thin copper clad, the copper pattern is likely to bend before it is covered with an insulating layer, and it is difficult to handle the laminate board during the formation of the conductive pattern. If the thickness of the copper clad is reduced during the pattern forming, the number of steps increases. In addition, the etching precision in terms of depth must be rigorously controlled, and work efficiency may drop. With conventional techniques, it is difficult to fabricate a package substrate with fine conductive patterns and fine interconnections (i.e., through-holes).

SUMMARY OF THE INVENTION

This invention was conceived in order to overcome the problems of the prior art, and it is one of the objectives of the invention to provide a substrate for a semiconductor package that has a fine circuit pattern, with high reliability for electrical connection and a simple structure.

It is another objective of the invention to provide a method for manufacturing a substrate for a semiconductor package, which allows a fine pattern to be formed in a reliable manner.

It is still another objective to provide a semiconductor package using the above-mentioned substrate and a manufacturing method thereof.

To achieve these objectives, a substrate for use in a semiconductor package comprises a base having pillar-like interconnections and a resin filling a gap between the interconnections, and a conductive pattern formed on the base. The interconnection is made of a first metal having a first etching characteristic. The conductive pattern is made of a second metal that has a second etching characteristic different to the first etching characteristic with respect to a same etchant.

The first metal is selected from copper (Cu), copper alloy, or iron-nickel alloy. The second metal is selected from nickel (Ni), cromium (Cr), titanium (Ti), tin (Sn), zinc (Zn), or an alloy containing at least one of these elements.

Preferably, the conductive pattern consists of a second metal layer and a third metal layer formed on the second metal layer. In this case, the etching characteristic of the second metal layer is different to that of the first metal with respect to a same etchant.

In the second aspect of the invention, a semiconductor package comprises a substrate including a base with pillar-like interconnections, and a chip mounted on the first surface of the substrate so as to be electrically connected to the interconnections. The interconnections are made of a first metal, and the gap between the interconnections is filled with a resin. A conductive pattern made of a second metal is formed on the base. The second metal has an etching characteristic different from that of the first metal with respect to the same etchant. The semiconductor package also has solder balls connected to the interconnection at a second surface of the substrate opposite to the first surface. The semiconductor chip is encapsulated with a resin seal.

In the third aspect of the invention, a method for fabricating a substrate for use in a semiconductor package is provided. In this method, a composite metal laminate consisting of a first metal layer, second metal layer, and a carrier layer positioned in this order is prepared. The first metal layer has an etching characteristic different from that of the second metal layer with respect to the same etchant. Then, the first metal layer is selectively etched until the second metal layer is exposed, thereby forming pillar-like interconnections. The gap between the interconnections is filled with a resin so as to form a resin base with interconnections. Then, the carrier layer is removed from the second metal layer, and the second metal layer is selectively etched until the first metal layer or the resin base is exposed, thereby forming a conductive pattern on the resin base. The carrier layer is, for example, a polyimide film.

In an alternative method, the carrier layer is a metallic layer. To be more precise, a composite metal laminate consisting of a first metal layer, second metal layer, and a third metal layer positioned in this order is prepared. The first metal layer has an etching characteristic different from that of the second metal layer. The surface of the third metal layer is covered with a resist, and the first metal layer is selectively etched until the second metal layer is exposed, thereby forming a predetermined pattern of interconnections. The gap between the interconnections is filled with a resin so as to form a resin base with interconnections. Then, the third metal layer is selectively etched by a first etchant until the second metal layer is exposed, thereby forming a predetermined pattern. Subsequently, the second metal layer is selectively etched by a second etchant using said pattern as an etching mask until the first metal layer or the resin base is exposed, thereby completing a conductive pattern on the resin base.

During the fabrication of a semiconductor package, an insulating layer is placed over the conductive pattern, leaving a portion of the conductive pattern exposed, and a semiconductor chip is placed onto the exposed conductive pattern. The semiconductor chip is electrically connected to the interconnections. Finally, the entirety of the semiconductor chip is encapsulated with a resin seal.

The methods provided by the present invention do not require drilling the substrate for forming interconnections. In addition, the substrate can maintain sufficient mechanical strength during the patterning of the interconnections because of the carrier layer (either non-metallic or a metallic layer). The resultant substrate has a fine conductive pattern and interconnection, while guaranteeing reliable electric conductivity.

BRIEF DESCRIPTION OF THE DRAWINGS

Other objects and advantages will be apparent from the following detailed description of the invention in conjunction with the attached drawings, in which.

DETAILED DESCRIPTION OF THE PREFERED EMBODIMENTS

The preferred embodiments of the package substrate and the semiconductor package using this substrate will now be described in detail.

First Embodiment

Figure 1:
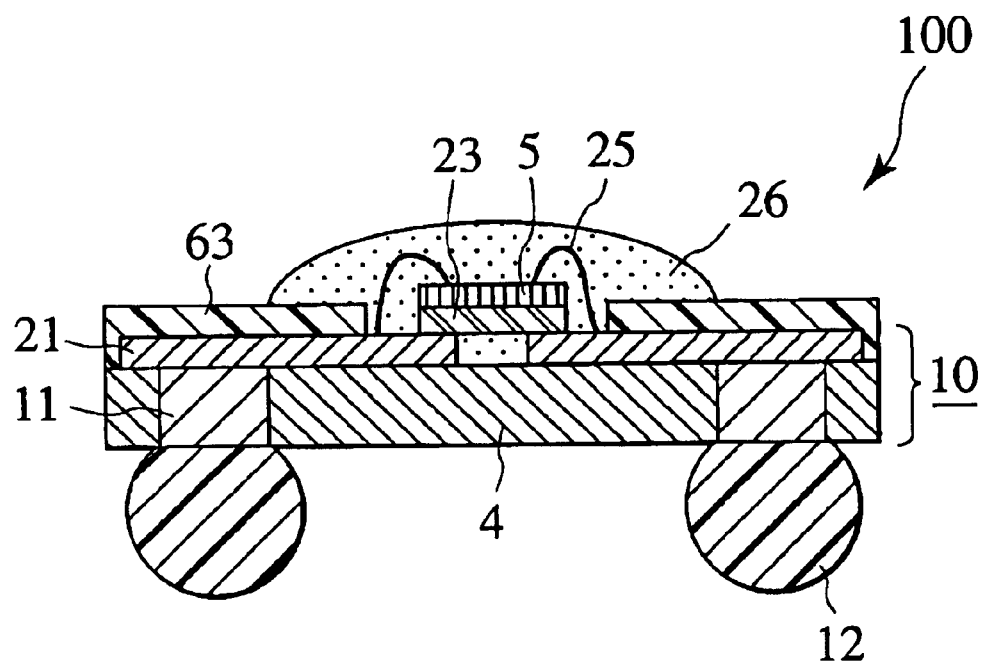
FIG. 1 illustrates an example of semiconductor package using a package substrate according to the first embodiment of the invention.

FIG. 1 illustrates a semiconductor package 100, which includes a substrate 10, a chip 5 mounted on the substrate 10, an insulating layer 63 covering a portion of the substrate 10 excluding the area in which the chip 5 is mounted.

The substrate 10 comprises pillar-like interconnections 11 made of a first metal, a resin 4 filling the gap between the interconnections 11, and a conductive pattern 21 made of a second metal. The etching characteristics of the first metal differ from those of the second metal. In other words, the second metal is a material that can not be etched by the etchant used to etch the first metal, and vice versa.

The first metal for the interconnection 11 is selected from copper (Cu), copper alloy, and iron-nickel (Fe—Ni) alloy. If the first metal is copper (Cu) or copper alloy, the second metal is nickel (Ni), nickel alloy, titanium (Ti), cromium (Cr), tin (Sn), or zinc (Zn). If the first metal is Fe—Ni alloy, the second metal is titanium (Ti), cromium (Cr), or tin (Sn).

In the first embodiment, the first metal is copper (Cu), and the second metal is nickel (Ni). The first metal (Cu) is easily etched by an alkaline etchant, while the second metal (Ni) is hardly etched at all by an alkaline etchant.

The thickness of the pillar-like interconnection 11 is 12 $\mu$m to 100 $\mu$m. If the thickness of the interconnection 11 exceeds 100 $\mu$m, the etching precision of the interconnection 11 is beyond ±50 $\mu$m, and reliability of electrical connection can not be achieved. If the thickness of the interconnection 11 is less than 12 $\mu$m, the resin base 4 also becomes thin, and the mechanical strength of the substrate decreases. In addition, the insulating ability of the resin base 4 deteriorates. Preferably, the thickness of the interconnection 11 and the resin base 4 is in the range of 18 $\mu$m to 70 $\mu$m.

The thickness of the conductive pattern 21 is 0.05 $\mu$m to 50 $\mu$m. If the thickness of the conductive pattern 21 exceeds 50 $\mu$m, the etching precision of the conductive pattern 21 will be beyond ±25 $\mu$m, and the circuit pattern can not be sufficiently fine. If the conductive pattern 21 is thinner than 0.05 $\mu$m, the etching characteristics of the second metal (i.e., the conductive pattern 21) may be affected by the etching characteristics of the first metal (i.e., the interconnection 11).

The resin base 12 and the conductive pattern 21 are covered with an insulating layer 63, excluding the area in which the chip 5 is to be mounted. The insulating layer 63 is, for example, a resin or a solder resist. The resin that can be used includes a thermosetting resin such as epoxy resin, polyimide resin, silicone resin, polyamide imide resin; a photosensitive resin, such as polyimide resin and acrylic epoxy resin; a thermoplastic elastomer, such as ethylene-propylene resin and styrene-butadiene; and a liquid crystal polymer.

The thickness of the insulating layer 63 is in a range of 5 µm to 100 µm. Beyond 100 µm, the insulating layer 63 may prevent the I/O terminals of the semiconductor chip 5 from being electrically connected to the interconnection 11. Below 5 µm, the insulating ability is lowered, and the semiconductor chip 5 may come into contact with the conductive pattern 21, causing short-circuit. A more preferable range is from 10 µm to 80 µm.

The semiconductor package 100 also has solder balls 12 for electrical connection to the external wiring board (not shown). The solder balls 12 are connected to the interconnection 11 at the surface opposite to the chip-mount surface. The solder ball 12 is made of lead-tin (Pb—Sn) solder or lead-free solder. The lead-free solder to be used includes, for example, tin (Sn), silver (Ag), bismuth (Bi), and indium (In). The size of the solder ball 12 ranges from 8 µm to 150 µm. Below 8 µm, the mechanical strength and connection reliability are insufficient. Beyond 150 µm, the height and the pitch of the solder ball 12, which functions as connection terminal to the external wiring board, become too large and unsuitable for a semiconductor package.

The semiconductor chip 5 is encapsulated within molding resin 26. The molding resin 26 is selected from epoxy resin, polyimide resin, phenol resin, silicone resin, liquid crystal polymer, or polyether amide resin.

FIGS. 2A through 2H illustrate a process of fabricating the semiconductor package 100 shown in FIG. 1. Especially, FIGS. 2A through 2F illustrate the process of fabricating a package substrate 10 used in the semiconductor package 100.

Figure 2A:
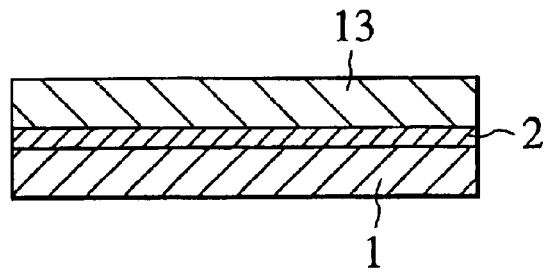
FIGS. 2A through 2H illustrate a process of manufacturing the semiconductor package shown in FIG. 1.

First, as illustrated in FIG. 2A, a composite metal laminate is prepared. This laminate consists of a first metal layer 1, and a second metal layer 2 positioned on the first metal layer 1. The composite metal laminate is mounted on a carrier layer 13. The first metal layer 1 is relatively thick, as compared with the second metal layer 2. The second metal layer 2 has etching characteristics that differ from those of the first metal layer 1. In the preferred embodiment, the laminate consists of a 35 µm copper (Cu) layer 1, a 5 µm nickel (Ni) layer 2, and a polyimide carrier layer 13 with an adhesive.

The carrier layer 13 may either be an insulating resin sheet, an insulating film, or a metallic foil. Although, in the embodiment, a polyimide layer 13 is used, epoxy resin, silicone resin, phenol resin may be used as the insulating resin. The insulating film is, for example, polyimide, or polyethylene terephthalate. The metallic foil includes copper foil, copper alloy foil, iron-nickel (Fe—Ni) alloy foil. The thickness of the carrier layer 13 is in a range of 12 µm to 100 µm. If the carrier layer 13 is thinner than 12 µm, the mechanical strength drops, and it could easily crease during shipping or transportation. If the carrier layer 13 is thicker than 100 µm, it lacks flexibility, and as a result, the carrier layer 13 could easily crack or peel off. Preferably, the thickness of the carrier layer 13 ranges from 18 µm to 70 µm.

In order to fabricate the composite metal laminate, the surface of an insulating sheet is roughened, and the second metal (Ni) layer 2 and the first metal (Cu) layer are subsequently formed on the carrier layer 13 by electroless plating, under the reaction of a plating catalyst. Alternatively, after the second metal (Ni) layer 2 is formed on the carrier layer 13, the first metal (Cu) layer 1 may be formed on the second metal layer 2 by electroplating. Yet another method is forming the second metal layer 2 on the first metal layer 1 by electroplating to form a composite metal laminate and then, bonding this laminate onto the carrier layer (i.e., an insulating sheet or an insulating film) 13. The thickness of the first metal (Cu) layer 1 is about 50 µm in this example.

Figure 2B:
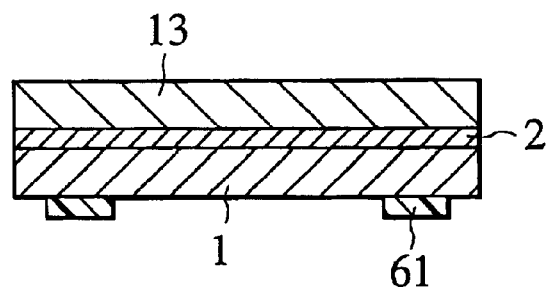

Next, as illustrated in FIG. 2B, etching resist 61 is formed on the surface of the first metal (Cu) layer 1 in a predetermined pattern. The etching resist 61 is, for example, an etching resist dry film HY-920 (manufactured and sold by Hitachi Chemical Co., Ltd.), which is laminated on the first metal layer 1. This dry film is exposed to ultraviolet rays through a photomask, and developed. In this example, the illuminated portions remain to cover the first metal layer 1.

Figure 2C:
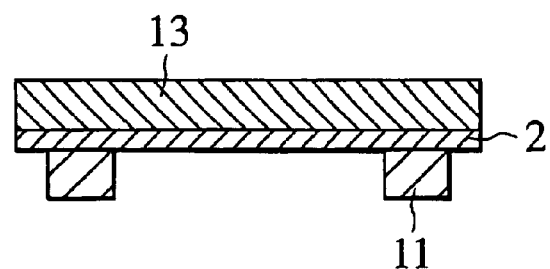

Then, as illustrated in FIG. 2C, the first metal (Cu) layer 1 is etched using the patterned resist 61 as a mask, until the second metal 2 is exposed. The etchant is an alkaline etchant, such as thiosulfate ammonium solution. The resist 61 is removed, and pillar-like interconnections 11 remain. The ratio of the etching rate of the alkaline etchant for the first metal (Cu) to the etching rate for the second metal (Ni) is about 100. By carrying out the etching process for about 2 minutes, the first metal (Cu) is efficiently etched without damaging the second metal (Ni). The feature of the invention is two different metals with different etching characteristics are used, one for a conductive pattern and the other for interconnection. Unlike the conventional substrate, it is not necessary to drill the laminate board and fill the hole with a metal. The substrate of the present invention is suitable for fine interconnection at high precision.

Figure 2D:
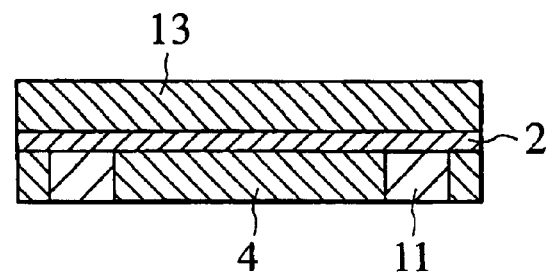

Next, as illustrated in FIG. 2D, the gap between interconnections 11 is filled with resin 4 by screen-printing. In the preferred embodiment, liquid epoxy resin CEL-C-4100 (manufactured and sold by Hitachi Chemical Co., Ltd.) is used as the resin 4. In this manner, a resin base 4 with interconnections 11 penetrating it is completed. By filling the gap with a resin, the mechanical strength of the substrate is guaranteed, allowing the second metal layer to be etched without crinkling or peeling off in the subsequent steps.

Figure 2E:
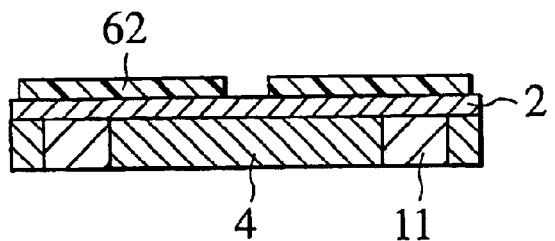

Next, as is illustrated in FIG. 2E, the carrier layer 13 is mechanically removed, and etching resist pattern 62 is formed on the second metal (Ni) layer 2 using the same technique as in FIG. 2B. In this step, the etching resist (i.e., the dry film) 62 remains in portions corresponding to the conductive pattern 21.

Figure 2F:
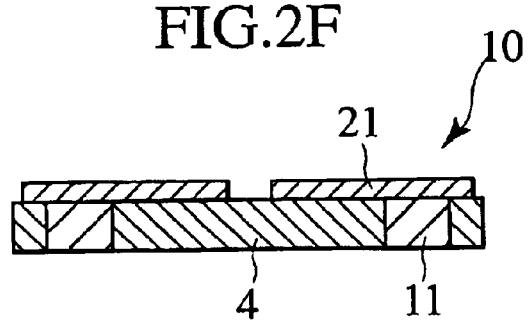

Next, as is illustrated in FIG. 2F, the second metal (Ni) layer 2 is etched until the resin base 4 or the first metal layer 1 is exposed. The etchant used for this etching contains as main components aqueous hydrogen peroxide ($H_2O_2$) and sulfuric acid solution ($H_2SO_4$). The second metal layer 2 is much thinner than the interconnection 11 made of the first metal (Cu) or the resin base 4, which is about 50 µm thick. The etching time for the second metal layer is about three (3) minutes. This acidic etching may slightly etch the first metal (Cu). However, taking the difference in thickness of the first and second metal layers and the etching time into consideration, the acidic etching hardly affects the first metal (Cu) interconnection in reality. The etching resist 62 is then removed, and the conductive pattern 21 is formed on the resin base 4.

Figure 2G:
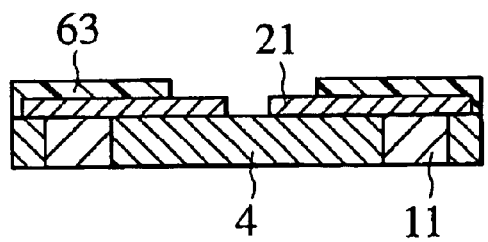

Next, as illustrated in FIG. 2G, insulating layer 63 of thickness of about 30 µm is formed over the second metal layer 2 by screen-printing in such a manner that the center portion of the substrate is exposed. The insulating layer 63 is solder resist SR-7100 (manufactured and sold by Hitachi Chemical Co., Ltd.) in the preferred embodiment. The solder resist 63 protects the conductive pattern 21.

Figure 2H:
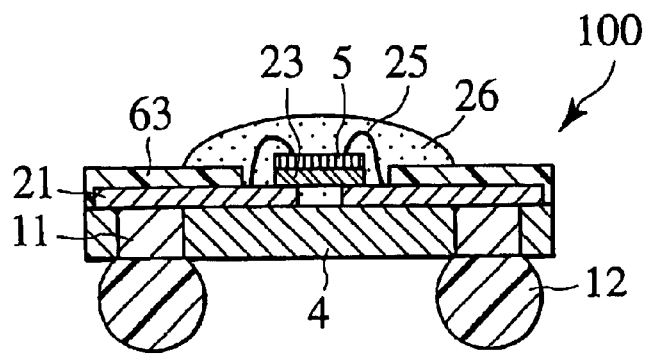

Finally, as illustrated in FIG. 2H, a semiconductor chip 5 is placed onto the exposed portion of the substrate 10, and is fixed to the conductive pattern 21 via an insulating adhesive 23. The I/O terminals (not shown) of the chip 5 are connected to the conductive patterns 21 by wire bonding 25. A solder ball 12 with a diameter of 300 µm, which consists of 60% of lead (Pb) and 40% of tin (Sn), is placed in the bonding position. Then, the substrate 10 is placed in the reflow furnace and heated at 240° C. for electrical connection. The chip 5 is encapsulated with epoxy resin 26 (which is CEL-9200 manufactured and sold by Hitachi Chemical Co., Ltd. in the preferred embodiment) using a molding die to complete the semiconductor package 100. The thickness of the resultant package 100 is 800 µm.

The package substrate 10 has fine interconnections and conductive pattern, while guaranteeing electrical connection. In addition, the above-described method allows both the interconnection 11 and the conductive pattern 21 to be formed by simple steps, and the conductive pattern with a line width of 25 µm can be achieved, which is greatly improved as compared with the conventional line width of about 50 µm.

Second Embodiment

In the second embodiment, the conductive pattern 41 consists of a second metal layer 32 and a third metal layer 33 that reinforces the second metal layer 32. In the first embodiment, the carrier layer 13 is an insulating sheet, and it is mechanically removed after the resin base 4 has been formed. In the second embodiment, the carrier layer is a metallic foil (i.e., the third metal layer) 33, which becomes a part of the conductive pattern 31. The metallic foil is for example, Cu, Cu alloy, or Fe-Nickel alloy, depending on the materials used for the first and second metal layers. Elements that are the same as those in the first embodiment are denoted by the same numerical reference, and their explanation will be omitted.

Figure 3:
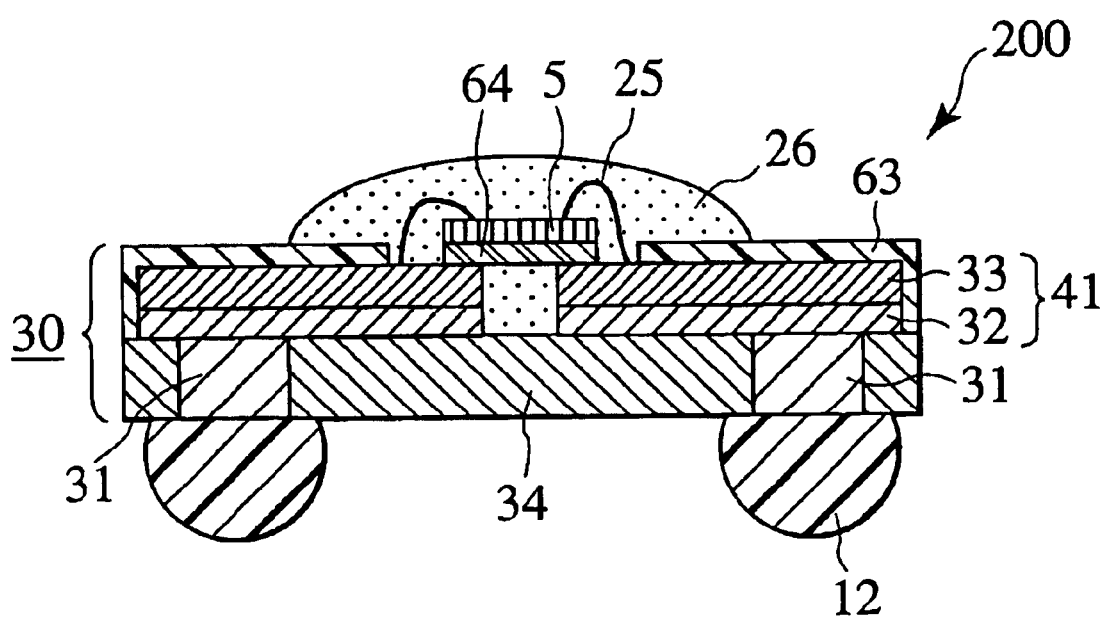
FIG. 3 illustrates an example of semiconductor package using a package substrate according to the second embodiment of the invention.

FIG. 3 illustrates a semiconductor package 200, which includes a substrate 30, a chip 5 mounted on the substrate 30, an insulating layer 63 covering a portion of the substrate 30 excluding the area in which the chip 5 is mounted.

The substrate 30 comprises pillar-like interconnections 31 made of a first metal, a resin 34 filling the gap between the interconnections 31, and a conductive pattern 41 consisting of a second metal layer 32 and a third metal layer 33. The etching characteristics of the first metal 31 differ from those of the second metal 32. In other words, the second metal 32 is a material that can not be etched by an etching means for the first metal 31, and vise versa. In the second embodiment, the first metal is Fe—Ni alloy, and the second metal is titanium (Ti). The first metal is etched at all by ferric chloride (FeCl$_3$) solution, while the second metal is hardly etched by this etchant.

The thickness of the second metal layer 32 is 0.05 µm to 50 µm. If the thickness of the second metal layer 32 exceeds 50 µm, the etching precision of the conductive pattern 31 will be beyond ±25 µm, and the circuit pattern can not be sufficiently fine. If the second metal layer 32 is thinner than 0.05 µm, the etchant used to form the interconnection 31 may etch the third metal layer 33 due to pits or defects generated in the second metal layer 32 during the etching of the first metal 31. Accordingly, the preferred range of the thickness of the second metal layer 32 is 0.1 µm to 35 µm.

The thickness of the third metal layer 33 preferably ranges from 1 µm to 50 µm. If the thickness of the third metal layer 33 exceeds 50 µm, the etching precision of the conductive pattern 41 will be beyond ±25 µm, and the circuit pattern can not be sufficiently fine. If the third metal layer 33 is thinner than 1 µm, it lacks of mechanical strength as a carrier layer. More preferably, the thickness of the third metal layer 33 is from 5 µm to 12µm.

FIGS. 4A through 4H illustrate a process of fabricating the semiconductor package 200 shown in FIG. 3. More specifically, FIGS. 4A through 4F illustrate a process of fabricating a package substrate 30 used in the semiconductor package 200.

Figure 4A:
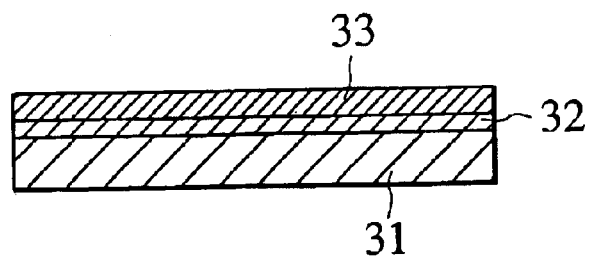
FIGS. 4A through 4H illustrate a process of manufacturing another example of semiconductor package according to the second embodiment of the invention.

First, as illustrated in FIG. 4A, a composite metal laminate is prepared. This laminate consists of a first metal layer 31, a second metal layer 32 positioned on the first metal layer 31, and a third metal layer 33 positioned on the second metal layer 32. The third metal layer 33 functions as a part of conductive patterns, and at the same time, functions as a carrier layer before the conductive patterns 41 are formed. The first metal layer 31 is relatively thick, as compared with the second metal layer 32. The second metal layer 32 has etching characteristics that differ from those of the first metal layer 31. In the preferred embodiment, the laminate consists of a 50 µm Fe—Ni alloy layer 31, a 1 µm titanium (Ti) layer 32, and a 10 µm copper (Cu) layer 33.

The thickness of the third metal layer 33, which functions as a carrier layer, is in a range of 5 µm to 100 µm. If the third metal layer 33 is thinner than 5 µm, the mechanical strength drops, and it could easily crease during shipping or transportation. If the third metal layer 33 is thicker than 100 µm, it lacks flexibility, and as a result, the third metal layer 33 could easily crack or peel off. Preferably, the thickness of the third metal layer 33 ranges from 7 µm to 70 µm.

In order to fabricate the composite metal laminate, the second metal (Ti) layer 32 is formed on the third metal (Cu) layer 33 by plating, and then, the first metal (Fe—Ni alloy) layer 31 is formed on the second metal (Ti) layer 32 by electroplating. An alternative method is forming the second metal layer 32 on the first metal layer 31 by plating, and forming the third metal layer 33 on the second metal layer 32 again by plating. The etching characteristics of the first metal (Fe—Ni alloy) layer 31 with respect to a specific etchant differ from those of the second metal (Ti) layer 32.

Figure 4B:
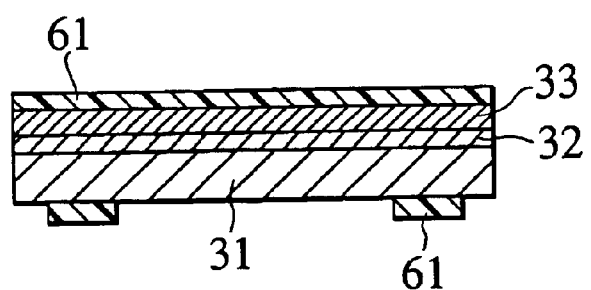

Next, as illustrated in FIG. 4B, etching resist 61 is formed on the surface of the first metal (Fe—Ni alloy) layer 31, and processed into a predetermined pattern. The surface of the third metal layer 33 is also covered with etching resist 61. The etching resist 61 is, for example, an etching resist dry film HY-920 (manufactured and sold by Hitachi Chemical Co., Ltd.), which is laminated on the first metal layer 31. This dry film is exposed to ultraviolet rays through a photomask, and developed. In this example, the illuminated portions remain to cover the first metal layer 31.

Figure 4C:
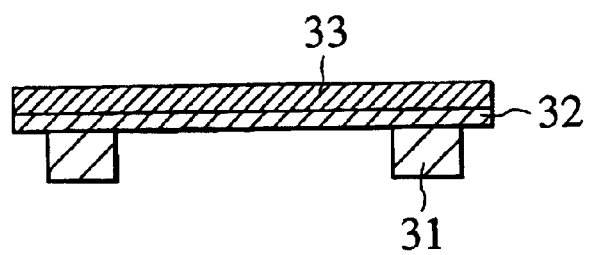

Then, as illustrated in FIG. 4C, the first metal (Fe—Ni alloy) layer 31 is etched using the patterned resist 61 as a mask, until the second metal (Ti) layer 32 is exposed. The etchant is ferric chloride (FeCl$_3$) solution. The ratio of the etching rate of the ferric chloride for the first metal (Fe—Ni alloy) to the etching rate for the second metal (Ti) is about 100. By carrying out the etching with the ferric chloride for about two minutes, the first metal is etched efficiently, without damaging the second metal. After the etching, the etching resist 61 is removed from the first and third metal layers 31 and 33. Thus, the pillar-like interconnections 31 are formed.

Figure 4D:
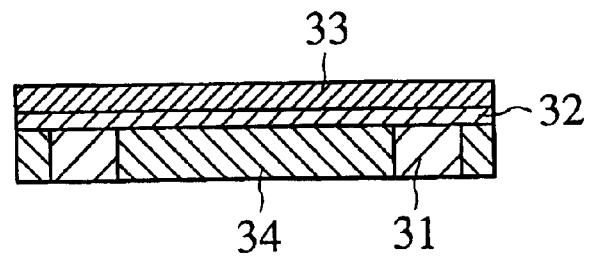

Next, as illustrated in FIG. 4D, the gap between interconnections 31 is filled with resin 34 by screen-printing. In the preferred embodiment, liquid epoxy resin CEL-C-7200 (manufactured and sold by Hitachi Chemical Co., Ltd.) is used as the resin 34. In this manner, a resin base 34 with interconnections 11 penetrating it is completed.

Figure 4E:
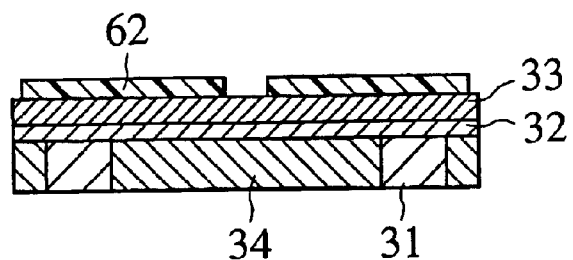

Next, as illustrated in FIG. 4E, etching resist pattern 62 is formed on the third metal (Cu) layer 2 using the same technique as in FIG. 4B. In this step, the etching resist (i.e., the dry film) 62 remains in the portions corresponding to the conductive pattern 41.

Figure 4F:
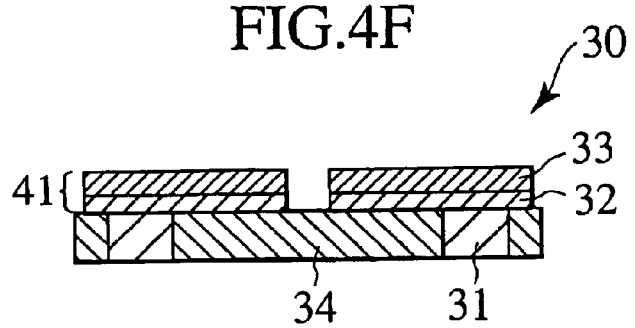

Next, as illustrated in FIG. 4F, the third metal (Cu) layer 33 is selectively etched until the second metal (Ti) layer 32 is exposed using an alkaline etchant, e.g., ammonium thiosulfate aqueous. The first metal (Fe—Ni alloy) 31 and the second metal (Ti) layer 32 are hardly etched at all by this alkaline etchant. Then, an acid etchant, which is in this embodiment sulfuric acid/hydrogen peroxide aqueous, is used to selectively etch the second metal (Ti) layer 32, until the first metal (Fe—Ni alloy) layer 31 or the resin base 34 is exposed. During the acid etching, the first metal (Fe—Ni alloy) 31 may be slightly etched; however, this does not affect the electrical property of the substrate because the first metal layer 31 is much thicker than the second metal layer. In addition, the etching time for the second metal layer 32 is short, and the surface of the first metal 31 is not damaged much. Then, the resist 62 is removed from the third metal 33. In this manner, the conductive pattern 41 consisting of the second and third metal layers 32 and 33 is formed on the resin base 34.

Figure 4G:
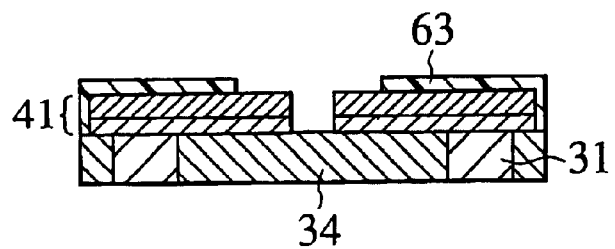
Figure 4H:
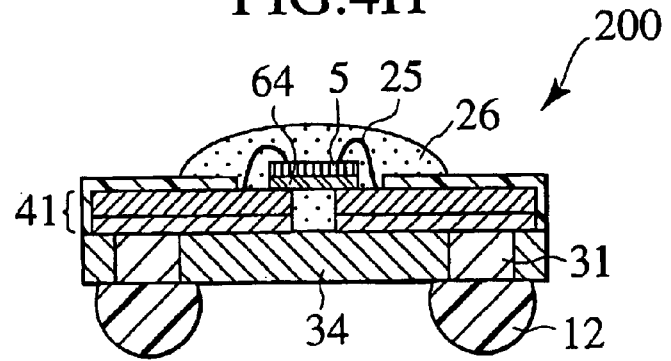

Next, as illustrated in FIG. 4G, insulating layer 63 of thickness of about 20 μm is formed over the third metal layer 33 by screen-printing, so that a portion of the conductive pattern 41 is exposed. The insulating layer 63 is solder resist SR-7100 (manufactured and sold by Hitachi Chemical Co., Ltd.) in the preferred embodiment.

Finally, as illustrated in FIG. 2H, a semiconductor chip 5 is fixed onto the substrate 30. To be more precise, anisotropic conductive film 64 is bonded to the conductive pattern 41 that is not covered with the solder resist 63. Then, the semiconductor chip 5 is placed on the anisotropic conductive film 64 so that the leads (or the I/O terminals) of the chip 5 are electrically connected to the conductive pattern 41. The chip 5 and the substrate 30 are heated at 170° C. for two minutes under a pressure of 0.5 Mpa in order to fix the chip 5 onto the substrate 30. A solder ball 12 with a diameter of 600 μm, which consists of 60% of lead (Pb) and 40% of tin (Sn), is placed on the bonding position. Then, the substrate 30 is placed in the reflow furnace and heated at 240° C. for electrical connection. The chip 5 is encapsulated with epoxy resin 26 (which is CEL-9200 manufactured and sold by Hitachi Chemical Co., Ltd. in the preferred embodiment) using a molding die to complete the semiconductor package 100. The thickness of the resultant package 200 is 500 μm.

In the first and second embodiments, the interconnections and the conductive patterns are formed in the package substrate, making use of the difference in the etching characteristics of the materials. Accordingly, fine conductive patterns with a line width of 25 μm can be formed by relatively simple steps, while guaranteeing the mechanical strength and reliability in electrical connection. The conventional package substrate has conductive patterns with a line width of about 50 μm because the etching precision is limited by the thickness of the metal foil. The substrate and the semiconductor package of the present invention can greatly improve the minuteness of the conductive patterns. In addition, the manufacturing process for the substrate and the semiconductor package can be facilitated.

Although the invention has been described based on the preferred embodiment, the invention is not limited to the example, and there are many changes and substitutions that can be made without departing from the scope of the invention.

For example, the gap between the interconnections may be filled with a resin so that the pillar-like interconnections project slightly from the resin surface. In such a case, the connection of solder balls to the interconnections becomes easier. Alternatively, the resin paste may be screen-printed so as to be higher than the pillar-like interconnections 31. Then the resin layer is polished until the interconnection (i.e., the first metal) 31 is exposed.

What is claimed is:

1. A method for fabricating a substrate for we in a semiconductor package, comprising:

preparing a composite metal laminate comprising a first metal layer, a second metal layer, and a carrier layer positioned in ties order, the first metal layer having a first etching characteristic, and the second metal layer having a second etching characteristic that is different from the first etching characteristic;

selectively etching the first metal layer until the second metal layer is exposed, thereby forming interconnections;

filling a gap between the interconnections with a resin so as to form a resin base;

removing the carrier layer from the second metal layer; and selectively etching the second metal layer until the first metal layer or the resin base is exposed, thereby forming a conductive pattern on the resin base.

2. The method of claim 1, wherein the interconnections take the form of pillars.

3. The method of claim 1, further comprising forming an insulating layer over the conductive pattern In which a portion of the conductive pattern is exposed.

4. The method of claim 1, wherein the second metal layer comprises at least one of Ni, Cr, Ti, Sn, or Zn.

5. The method of claim 1, wherein the first metal layer comprises copper, copper alloy, or iron-nickel alloy.

6. A method for fabricating a substrate for use in a semiconductor package, comprising:

preparing a composite metal laminate comprising a first metal layer, a second metal layer, and a third metal layer positioned in this order, the first metal layer having a first etching characteristic, and the second metal layer having a second etching characteristic that is different from the first etching characteristic;

covering the surface of the third metal layer with a resist, and selectively etching the first metal layer until the second metal layer is exposed, thereby forming a first pattern of interconnections;

filling a gap between the interconnections with a resin so as to form a resin base;

selectively etching the third metal layer by a first etchant until the second metal layer is exposed, thereby forming a second pattern; and selectively etching the second metal layer by a second etchant using said second pattern as an etching mask until the first metal layer or the resin base is exposed, thereby completing a conductive pattern on the resin base.

7. The method of claim 6, wherein the interconnections take the form of pillars.

8. The method of claim 6, further comprising forming an insulating layer over the conductive pattern in which a portion of the conductive pattern is exposed.

9. The method of claim 6, wherein the second metal layer comprises at least one of Ni, Cr, Ti, Sn, or Zn.

10. The method of claim 6, wherein the first metal layer comprises copper, copper alloy, or iron-nickel alloy.

* * * * *

UNITED STATES PATENT AND TRADEMARK OFFICE
CERTIFICATE OF CORRECTION

PATENT NO. : 6,708,398 B2
DATED : March 23, 2004
INVENTOR(S) : Y. Wakashima et al.

It is certified that error appears in the above-identified patent and that said Letters Patent is hereby corrected as shown below:

<u>Column 10,</u>
Line 2, "we" should be -- use --.
Line 7, "ties" should be -- this --.
Line 27, "In" should be -- in --.

Signed and Sealed this

Seventh Day of December, 2004

JON W. DUDAS
*Director of the United States Patent and Trademark Office*